(12) United States Patent
Yamazaki et al.

(10) Patent No.: US 6,323,069 B1
(45) Date of Patent: *Nov. 27, 2001

(54) METHOD OF MANUFACTURING A THIN FILM TRANSISTOR USING LIGHT IRRADIATION TO FORM IMPURITY REGIONS

(75) Inventors: Shunpei Yamazaki, Tokyo; Yasuhiko Takemura, Kanagawa, both of (JP)

(73) Assignee: Semiconductor Energy Laboratory Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/768,850

(22) Filed: Dec. 17, 1996

Related U.S. Application Data

(62) Division of application No. 08/501,299, filed on Jul. 12, 1995, now abandoned, which is a division of application No. 08/035,582, filed on Mar. 23, 1993, now Pat. No. 5,696,011.

(30) Foreign Application Priority Data

Mar. 25, 1992 (JP) ................................................ 4-098805

(51) Int. Cl.$^7$ .................................................. H01L 21/84
(52) U.S. Cl. .......................... 438/160; 438/158; 438/487
(58) Field of Search ...................... 437/40 TFT, 40 TFI, 437/41 TFT, 173, 174, 913; 148/DIG. 90, DIG. 91, DIG. 92, DIG. 93; 438/158, 159, 160, FOR 184, 166, 487

(56) References Cited

U.S. PATENT DOCUMENTS 4,266,986  5/1981  Benton et al. .
4,377,421  3/1983  Wada et al. ............................. 257/51
4,561,906  12/1985  Calder et al. ................. 148/DIG. 93

(List continued on next page.)

FOREIGN PATENT DOCUMENTS 0 416 798   3/1991   (EP) .
0416798     3/1991   (EP) .
0456199     11/1991  (EP) .

(List continued on next page.)

OTHER PUBLICATIONS

Inoue et al., "Low Temperature CMOS Self–Aligning Poly–Si TFTs and Circuit Scheme Utilizing New Ion Doping and Masking Technique", Seiko Epson Corporation, TFT Research Laboratory, Aug. 12, 1991, pp. 555–558.

Large–Area Doping Process For Fabrication Of Poly–Si Thin Film Transistors Using Bucket Ion Source And XeCl Excimer Laser Annealing, Genshior Kawachi et al., Japanes Journal Of Applied Physcis, vol. 29, No. 12, Dec. 1990, pp. L2370–L2372.

McCullough et al., Applied Physics Letters, vol. 66, No. 16, Apr. 17, 1995, pp. 2060–2062.

Sera et al., IEEE Transactions on Electron Devices, vol. 36, Jan. 1, 1989, pp. 2868–2872.

(List continued on next page.)

Primary Examiner—Michael Trinh
(74) Attorney, Agent, or Firm—Nixon Peabody LLP

(57) ABSTRACT

In an inverted stagger type thin-film transistor, the preparing process thereof can be simplified, and the unevenness of the thin film transistor prepared thereby can be reduced. That is, disclosed is a preparing method which comprises selectively doping a semiconductor on a gate insulating film with an impurity to form source, drain, and channel forming regions, and conducting a laser annealing to them, or a preparing method which comprises selectively doping the semiconductor region with an impurity by a laser doping method.

17 Claims, 12 Drawing Sheets

U.S. PATENT DOCUMENTS

| | | | |
|---|---|---|---|
| 4,619,034 | 10/1986 | Janning | 148/DIG. 91 |
| 4,651,408 | 3/1987 | MacElwee et al. | 148/DIG. 91 |
| 4,698,486 | 10/1987 | Sheets | 250/492.2 |
| 4,727,044 | 2/1988 | Yamazaki . | |
| 4,743,567 | 5/1988 | Pandya et al. . | |
| 4,769,338 | 9/1988 | Ovshinsky et al. . | |
| 4,814,292 | 3/1989 | Sasaki et al. | 437/101 |
| 4,885,258 | 12/1989 | Ishihara et al. . | |
| 4,888,305 | 12/1989 | Yamazaki et al. . | |
| 4,959,700 * | 9/1990 | Yamazaki | 257/61 |
| 4,998,152 | 3/1991 | Batey et al. | 257/57 |
| 5,061,642 | 10/1991 | Fujioka | 437/11 |
| 5,070,379 | 12/1991 | Nomoto et al. | 437/189 |
| 5,141,885 * | 8/1992 | Yoshida et al. | 437/101 |
| 5,162,239 | 11/1992 | Winer . | |
| 5,172,203 | 12/1992 | Hayashi | 257/67 |
| 5,198,379 | 3/1993 | Adan | 437/41 |
| 5,208,476 | 5/1993 | Inoue | 257/408 |
| 5,219,786 | 6/1993 | Noguchi | 437/174 |
| 5,231,297 | 7/1993 | Nakayama et al. | 257/77 |
| 5,242,844 | 9/1993 | Hayashi | 438/152 |
| 5,264,383 | 11/1993 | Young . | |
| 5,278,093 | 1/1994 | Yonehara | 437/109 |
| 5,286,658 | 2/1994 | Shirakawa et al. | 437/10 |
| 5,286,659 | 2/1994 | Mitani et al. . | |
| 5,313,077 | 5/1994 | Yamazaki | 257/66 |
| 5,315,132 | 5/1994 | Yamazaki | 257/66 |
| 5,316,960 | 5/1994 | Watanabe et al. . | |
| 5,329,140 | 7/1994 | Sera | 257/51 |
| 5,340,999 * | 8/1994 | Takeda et al. | 257/66 |
| 5,352,291 | 10/1994 | Zhang et al. | 117/8 |
| 5,420,048 | 5/1995 | Kondo | 437/41 TFT |
| 5,474,941 | 12/1995 | Mitani et al. . | |
| 5,495,824 | 3/1996 | Yonehara et al. . | |
| 5,529,937 | 6/1996 | Zhang et al. | 437/10 |
| 5,530,265 | 6/1996 | Takemura | 257/66 |
| 5,541,128 | 7/1996 | Kwasnick et al. . | |
| 5,543,636 | 8/1996 | Yamazaki | 257/66 |
| 5,656,511 | 8/1997 | Shindo | 438/160 |
| 5,696,011 | 12/1997 | Yamazaki et al. . | |

FOREIGN PATENT DOCUMENTS

| | | | |
|---|---|---|---|
| 2 118 774 * | 11/1983 | (GB) . | |
| 57-085262 | 5/1982 | (JP) . | |
| 58-014524 | 1/1983 | (JP) . | |
| 58-2073 | 1/1983 | (JP) . | |
| 58-147069 * | 9/1983 | (JP) . | |
| 58-168278 * | 10/1983 | (JP) . | |
| 60-136262 | 7/1985 | (JP) . | |
| 60-245124 | 12/1985 | (JP) . | |
| 60-245172 | 12/1985 | (JP) . | |
| 60-245173 | 12/1985 | (JP) . | |
| 60-245174 | 12/1985 | (JP) . | |
| 61-116820 | 6/1986 | (JP) . | |
| 61-135110 | 6/1986 | (JP) . | |
| 61-263273 | 11/1986 | (JP) . | |
| 62-2531 * | 1/1987 | (JP) . | |
| 62-30379 | 2/1987 | (JP) . | |
| 62-104171 | 5/1987 | (JP) . | |
| 62-205664 | 9/1987 | (JP) . | |
| 62-171160 | 1/1988 | (JP) . | |
| 63-164 | 1/1988 | (JP) . | |
| 63-080570 | 4/1988 | (JP) . | |
| 63-168052 | 7/1988 | (JP) . | |
| 63-169767 | 7/1988 | (JP) . | |
| 63-237577 | 10/1988 | (JP) . | |
| 1-115162 * | 5/1989 | (JP) . | |
| 01-171274 | 7/1989 | (JP) . | |
| 01-187814 | 7/1989 | (JP) . | |
| 1-183854 | 7/1989 | (JP) . | |
| 1-241862 | 9/1989 | (JP) . | |
| 01-289251 | 11/1989 | (JP) . | |
| 233934 | 5/1990 | (JP) . | |
| 2-177422 | 7/1990 | (JP) . | |
| 2-222545 | 9/1990 | (JP) . | |
| 2177443 | 10/1990 | (JP) . | |
| 02-268443 | 11/1990 | (JP) . | |
| 02-272750 | 11/1990 | (JP) . | |
| 2310932 | 12/1990 | (JP) . | |
| 03-042868 | 2/1991 | (JP) . | |
| 3-034434 | 2/1991 | (JP) . | |
| 3-46374 | 2/1991 | (JP) . | |
| 3-91932 | 4/1991 | (JP) . | |
| 3-148836 | 6/1991 | (JP) . | |
| 3-203378 | 9/1991 | (JP) . | |
| 3-265143 | 11/1991 | (JP) . | |
| 4-139727 | 5/1992 | (JP) . | |
| 04-186737 | 7/1992 | (JP) . | |
| 04239732 | 8/1992 | (JP) . | |
| 04-269837 | 9/1992 | (JP) . | |
| 4360580 | 12/1992 | (JP) . | |
| 3-201538 * | 9/1991 | (JP) | 438/FOR 184 |

OTHER PUBLICATIONS

Sameshima et al., Japanese Journal of Applied Physics, vol. 28, Oct. 1989, pp. 1789–1793.

Kawachi et al., Japanese Journal of Applied Physics, vol. 29, Dec. 1, 1990, pp. L2370–L2372.

Wolf et al., Silicon Processing for the VLSI ERA, vol. 1, Jan. 1, 1986, pp. 175, 178–179.

Ultra LSI Process Data Handbook, Apr. 15, 1982, pp. 526–527.

08/286,290 –Filed: Aug. 05, 1994 –Patented (Specification, Drawings and Claims).

* cited by examiner

FIG. 5

| No. | MANUFACTURING STEP | |
|---|---|---|
| 1 | SUBSTRATE WASHING | |
| 2 | FORMATION OF TANTALUM FILM | SPUTTERING, 400nm |
| 3 | FORMATION OF GATE WIRING PATTERN ① | APPLICATION OF RESIST, EXPOSURE, DEVELOPMENT |
| 4 | ETCHING OF TANTALUM | MIXED ACID (5% NITRIC ACID + PHOSPHORIC ACID) |
| 5 | ANODIC OXIDATION OF TANTALUM | 200nm/250V |
| 6 | PEELING OF RESIST | REMOVING LIQUID |
| 7 | FORMATION OF SILICON NITRIDE FILM | PCVD, 200nm |
| 8 | SUBSTRATE WASHING | |
| 9 | FORMATION OF a-Si FILM | PCVD, 30nm |
| 10 | FORMATION OF a-Si REGION PATTERN ② | APPLICATION OF RESIST, EXPOSURE, DEVELOPMENT |
| 11 | ETCHING OF a-Si REGION | RIE, $CF_4$ |
| 12 | ASHING-PEELING OF RESIST | OXYGEN PLASMA, REMOVING LIQUID |
| 13 | SUBSTRATE WASHING | |
| 14 | FORMATION OF SILICON NITRIDE FILM | PCVD, 200nm |
| 15 | FORMATION OF SILICON NITRIDE MASK PATTERN ③ | APPLICATION OF RESIST, EXPOSURE, DEVELOPMENT |
| 16 | ETCHING OF SILICON NITRIDE MASK | BUFFER HYDROFLUORIC ACID |
| 17 | IMPLANTATION OF PHOSPHORUS ION | ION DOPING, $1 \times 10^{14}$ $CM^{-2}$, 10 KeV |
| 18 | SUBSTRATE WASHING | |
| 19 | ASHING-PEELING OF RESIST | OXYGEN PLASMA, REMOVING LIQUID |
| 20 | LASER ANNEALING | XeCl EXCIMER LASER |
| 21 | REMOVAL OF SILICON NITRIDE MASK | BUFFER HYDROFLUORIC ACID |
| 22 | SUBSTRATE WASHING | |
| 23 | FORMATION OF ALUMINUM FILM | SPUTTERING, 400nm |
| 24 | FORMATION OF ALUMINUM WIRING PATTERN ④ | APPLICATION OF RESIST, EXPOSURE, DEVELOPMENT |
| 25 | ETCHING OF ALUMINUM WIRING | MIXED ACID |
| 26 | ASHING-PEELING OF RESIST | OXYGEN PLASMA, REMOVING LIQUID |

FIG. 6

| NO. | MANUFACTURING STEP | |
|---|---|---|
| 1 | SUBSTRATE WASHING | |
| 2 | FORMATION OF ALUMINUM FILM | SPUTTERING, 400NM |
| 3 | FORMATION OF GATE WIRING PATTERN ① | APPLICATION OF RESIST, EXPOSURE, DEVELOPMENT |
| 4 | ETCHING OF ALUMINUM | MIXED ACID (5% NITRIC ACID + PHOSPHORIC ACID) |
| 5 | ANODIC OXIDATION OF ALUMINUM | 200nm/250V |
| 6 | PEELING OF RESIST | REMOVING LIQUID |
| 7 | FORMATION OF SILICON NITRIDE GATE INSULATING FILM | PCVD, 200nm |
| 8 | SUBSTRATE WASHING | |
| 9 | FORMATION OF a-Si FILM | PCVD, 30nm |
| 10 | FORMATION OF a-Si REGION PATTERN ② | APPLICATION OF RESIST, EXPOSURE, DEVELOPMENT |
| 11 | ETCHING OF a-Si REGION | RIE, CF |
| 12 | ASHING-PEELING OF RESIST | OXYGEN PLASMA, REMOVING LIQUID |
| 13 | SUBSTRATE WASHING | |
| 14 | FORMATION OF SILICON NITRIDE FILM | PCVD, 200nm |
| 15 | BACK EXPOSURE OF SILICON NITRIDE MASK PATTERN | APPLICATION OF RESIST, EXPOSURE, DEVELOPMENT |
| 16 | ETCHING OF SILICON NITRIDE MASK | BUFFER HYDROFLUORIC ACID |
| 17 | IMPLANTATION OF PHOSPHORUS ION | ION DOPING, $1 \times 10^{14}$ CM$^{-2}$, 10 KeV |
| 18 | SUBSTRATE WASHING | |
| 19 | ASHING-PEELING OF RESIST | OXYGEN PLASMA, REMOVING LIQUID |
| 20 | LASER ANNEALING | XeCl EXCIMER LASER |
| 21 | REMOVAL OF SILICON NITRIDE MASK | BUFFER HYDROFLUORIC ACID |
| 22 | SUBSTRATE WASHING | |
| 23 | FORMATION OF ALUMINUM FILM | SPUTTERING, 400nm |
| 24 | FORMATION OF ALUMINUM WIRING PATTERN ④ | APPLICATION OF RESIST, EXPOSURE, DEVELOPMENT |
| 25 | ETCHING OF ALUMINUM WIRING | MIXED ACID |
| 26 | ASHING-PEELING OF RESIST | OXYGEN PLASMA, REMOVING LIQUID |

FIG. 7

| NO. | MANUFACTURING STEP | |
|---|---|---|
| 1 | SUBSTRATE WASHING | |
| 2 | FORMATION OF ALUMINUM FILM | SPUTTERING, 400nm |
| 3 | FORMATION OF GATE WIRING PATTERN ① | APPLICATION OF RESIST, EXPOSURE, DEVELOPMENT |
| 4 | ETCHING OF ALUMINUM | MIXED ACID (5% NITRIC ACID + PHOSPHORIC ACID) |
| 5 | ANODIC OXIDATION OF ALUMINUM | 200nm/250V |
| 6 | PEELING OF RESIST | REMOVING LIQUID |
| 7 | FORMATION OF SILICON NITRIDE | PCVD, 200nm |
|  | GATE INSULATING FILM | |
| 8 | SUBSTRATE WASHING | |
| 9 | FORMATION OF a-Si FILM | PCVD, 30nm |
| 10 | FORMATION OF a-Si REGION PATTERN ② | APPLICATION OF RESIST, EXPOSURE, DEVELOPMENT |
| 11 | ETCHING OF a-Si REGION | RIE, CF$_4$ |
| 12 | ASHING-PEELING OF RESIST | OXYGEN PLASMA, REMOVING LIQUID |
| 13 | SUBSTRATE WASHING | |
| 14 | BACK IRRADIATION FOR LASER DOPING PHOSPHORUS | XeCl EXCIMER LASER, PH$_3$ |
| 15 | SUBSTRATE WASHING | |
| 16 | FORMATION OF ALUMINUM FILM | SPUTTERING, 400nm |
| 17 | FORMATION OF ALUMINUM WIRING PATTERN ③ | APPLICATION OF RESIST, EXPOSURE, DEVELOPMENT |
| 18 | ETCHING OF ALUMINUM WIRING | MIXED ACID |
| 19 | ASHING-PEELING OF RESIST | OXYGEN PLASMA, REMOVING LIQUID |

FIG. 8A

| NO. | MANUFACTURING STEP | |
|---|---|---|
| 1 | SUBSTRATE WASHING | |
| 2 | FORMATION OF ALUMINUM FILM | SPUTTERING, 400nm |
| 3 | FORMATON OF GATE WIRING PATTERN ① | APPLICATION OF RESIST, EXPOSURE, DEVELOPMENT |
| 4 | ETCHING OF ALUMINUM | MIXED ACID (5% NITRIC ACID + PHOSPHORIC ACID) |
| 5 | ANODIC OXIDATION OF ALUMINUM | 200nm/250V |
| 6 | PEELING OF RESIST | REMOVING LIQUID |
| 7 | FORMATION OF SILICON NITRIDE GATE INSULATING FILM | PCVD, 200nm |
| 8 | SUBSTRATE WASHING | |
| 9 | FORMATION OF a-Si FILM | PCVD, 30nm |
| 10 | FORMATION OF a-Si REGION PATTERN ② | APPLICATION OF RESIST, EXPOSURE, DEVELOPMENT |
| 11 | ETCHING OF a-Si REGION | RIE, CF$_4$ |
| 12 | ASHING-PEELING OF RESIST | OXYGEN PLASMA, REMOVING LIQUID |
| 13 | SUBSTRATE WASHING | |
| 14 | FORMATION OF SILICON NITRIDE FILM | PCVD, 200nm |
| 15 | FORMATION OF SILICON NITRIDE MASK PATTERN ③ | APPLICATION OF RESIST, EXPOSURE, DEVELOPMENT |
| 16 | ETCHING OF SILICON NITRIDE MASK | BUFFER HYDROFLUORIC ACID |
| 17 | ASHING-PEELING OF RESIST | OXYGEN PLASMA, REMOVING LIQUID |
| 18 | SUBSTRATE WASHING | |
| 19 | FORMATION OF NTFT PATTERN ④ | APPLICATION OF RESIST, EXPOSURE, DEVELOPMENT |

FIG. 8B

| NO. | MANUFACTURING STEP | |
|---|---|---|
| 20 | LASER DOPING OF PHOSPHORUS | XeCl EXCIMER LASER, $PH_3$ |
| 21 | ASHING-PEELING OF RESIST | OXYGEN PLASMA, REMOVING LIQUID |
| 22 | SUBSTRATE WASHING | |
| 23 | PTFT PATTERN FORMATION ⑤ | APPLICATION OF RESIST, EXPOSURE, DEVELOPMENT |
| 24 | LASER DOPING OF BORON | XeCl EXCIMER LASER, $B_2H_6$ |
| 25 | ASHING-PEELING OF RESIST | OXYGEN PLASMA, REMOVING LIQUID |
| 26 | SUBSTRATE WASHING | |
| 27 | REMOVAL OF SILICON NITRIDE MASK | BUFFER HYDROFLUORIC ACID |
| 28 | SUBSTRATE WASHING | |
| 29 | FORMATION OF ALUMINUM FILM | SPUTTERING, 400nm |
| 30 | FORMATION OF ALUMINUM WIRING PATTERN ⑥ | APPLICATION OF RESIST, EXPOSURE, DEVELOPMENT |
| 31 | ETCHING OF ALUMINUM WIRING | MIXED ACID |
| 32 | ASHING-PEELING OF RESIST | OXYGEN PLASMA, REMOVING LIQUID |

FIG. 9A

| NO. | MANUFACTURING STEP | |
|---|---|---|
| 1 | SUBSTRATE WASHING | |
| 2 | FORMATION OF TANTALUM FILM | SPUTTERING, 400nm |
| 3 | FORMATION OF GATE WIRING PATTERN ① | APPLICATION OF RESIST, EXPOSURE, DEVELOPMENT |
| 4 | ETCHING OF TANTALUM | MIXED ACID (5% NITRIC ACID + PHOSPHORIC ACID) |
| 5 | ANODIC OXIDATION OF TANTALUM | 200nm/250V |
| 6 | PEELING OF RESIST | REMOVING LIQUID |
| 7 | FORMATION OF SILICON NITRIDE GATE INSULATING FILM | PCVD, 200nm |
| 8 | SUBSTRATE WASHING | |
| 9 | FORMATION OF a-Si FILM | PCVD, 30nm |
| 10 | FORMATION OF a-Si REGION PATTERN ② | APPLICATION OF RESIST, EXPOSURE, DEVELOPMENT |
| 11 | ETCHING OF a-Si REGION | RIE, CF₄ |
| 12 | ASHING-PEELING OF RESIST | OXYGEN PLASMA, REMOVING LIQUID |
| 13 | SUBSTRATE WASHING | |
| 14 | FORMATION OF SILICON NITRIDE FILM | PCVD, 200nm |
| 15 | FORMATION OF SILICON NITRIDE STOPPER PATTERN ③ | APPLICATION OF RESIST, EXPOSURE, DEVELOPMENT |

FIG. 9B

| NO. | MANUFACTURING STEP | |
|---|---|---|
| 16 | ETCHING OF SILICON NITRIDE FILM | BUFFER HYDROFLUORIC ACID |
| 17 | FORMATION OF n⁺μ-Si FILM | PCVD, 500nm |
| 18 | FORMATION OF n⁺μ-Si REGION PATTERN ④ | APPLICATION OF RESIST, EXPOSURE, DEVELOPMENT |
| 19 | ETCHING OF n⁺μ-Si FILM | RIE, CF$_4$ |
| 20 | ASHING-PEELING OF RESIST | OXYGEN PLASMA, REMOVING LIQUID |
| 21 | SUBSTRATE WASHING | |
| 22 | FORMATION OF n⁺μ-Si REGION PATTERN ⑤ | APPLICATION OF RESIST, EXPOSURE, DEVELOPMENT |
| 23 | ETCHING OF n⁺μ-Si FILM | RIE, CF$_4$ |
| 24 | ASHING-PEELING OF RESIST | OXYGEN PLASMA, REMOVING LIQUID |
| 25 | SUBSTRATE WASHING | |
| 26 | FORMATION OF ALUMINUM FILM | SPUTTERING, 400nm |
| 27 | FORMATION OF ALUMINUM WIRING PATTERN ⑥ | APPLICATION OF RESIST, EXPOSURE, DEVELOPMENT |
| 28 | ETCHING OF ALUMINUM WIRING | MIXED ACID |
| 29 | ASHING-PEELING OF RESIST | OXYGEN PLASMA, REMOVING LIQUID |

FIG. 10

| NO. | MANUFACTURING STEP | |
|---|---|---|
| 1 | SUBSTRATE WASHING | |
| 2 | FORMATION OF ALUMINUM FILM | SPUTTERING, 400nm |
| 3 | FORMATION OF GATE WIRING PATTERN ① | APPLICATION OF RESIST, EXPOSURE, DEVELOPMENT |
| 4 | ETCHING OF ALUMINUM | MIXED ACID (5% NITRIC ACID + PHOSPHORIC ACID) |
| 5 | ANODIC OXIDATION OF ALUMINUM | 200nm/250V |
| 6 | PEELING OF RESIST | REMOVING LIQUID |
| 7 | FORMATION OF SILICON NITRIDE GATE INSULATING FILM | PCVD, 200nm |
| 8 | SUBSTRATE WASHING | |
| 9 | FORMATION OF a-Si FILM | PCVD, 30nm |
| 10 | FORMATION OF SILICON NITRIDE FILM | PCVD, 200nm |
| 11 | FORMATION OF SILICON NITRIDE STOPPER PATTERN | APPLICATION OF RESIST, BACK EXPOSURE, DEVELOPMENT |
| 12 | ETCHING OF SILICON NITRIDE FILM | BUFFER HYDROFLUORIC ACID |
| 13 | ASHING-PEELING OF RESIST | OXYGEN PLASMA, REMOVING LIQUID |
| 14 | SUBSTRATE WASHING | |
| 15 | FORAMTION OF n⁺ μ-Si FILM | PCVD, 500nm |
| 16 | FORMATION OF n⁺ μ-Si REGION PATTERN | APPLICATION OF RESIST, EXPOSURE, DEVELOPMENT |
| 17 | ETCHING OF n⁺ μ-Si, a-Si FILM | RIE, CF₄ |
| 18 | ASHING-PEELING OF RESIST | OXYGEN PLASMA, REMOVING LIQUID |
| 19 | SUBSTRATE WASHING | |
| 20 | FORMATION OF ALUMINUM FILM | SPUTTERING, 400nm |
| 21 | FORMATION OF ALUMINUM WIRING PATTERN ⑥ | APPLICATION OF RESIST, EXPOSURE, DEVELOPMENT |
| 22 | ETCHING OF ALUMINUM WIRING | MIXED ACID |
| 23 | ASHING-PEELING OF RESIST | OXYGEN PLASMA, REMOVING LIQUID |

METHOD OF MANUFACTURING A THIN FILM TRANSISTOR USING LIGHT IRRADIATION TO FORM IMPURITY REGIONS

This is a Divisional application of Ser. No. 08/501,299, filed Jul. 12, 1995, abandoned which is a Divisional application of Ser. No. 08/035,582, filed Mar. 23, 1993, U.S. Pat. No. 5,696,011.

BACKGROUND OF THE INVENTION

1. Field of the Invention

The present invention relates to a Metal-Insulator-Semiconductor (hereinafter referred to as MIS) type semiconductor device, and specifically relates to a MIS transistor. More specifically the present invention relates to a thin-film state MIS type semiconductor device, a thin-film transistor (hereinafter referred to as TFT) formed on an insulating substrate, and above all relates to a MIS type semiconductor device having a so-called inverse stagger type structure, a channel forming region of which is positioned above a gate electrode. The application fields of the present invention are semiconductor integrated circuit formed on an insulating substrate, for example an active matrix type circuit used in a liquid crystal display, a driving circuit for an image sensor and the like.

2. Description of the Related Art

In recent years, a thin-film state MIS type semiconductor device formed on an insulating substrate has been used. For example an active matrix type liquid crystal display etc. have been known. There are two kinds of active matrix type circuit which are on the present market, one is a TFT using type and the other is such diode as a MIM (Metal Insulator Metal) using type. Particularly, the former has been successfully manufactured recently because it has given a high quality image.

As an active matrix circuit using TFT, two sorts of TFT, which employ such polycrystal semiconductor as polycrystal silicon and such amorphous semiconductor as amorphous silicon, have been known. The former has a difficulty in preparation for a large picture owing to its preparing process, and then the latter, which can be prepared at a temperature of 350 or below, has been mainly used for a large picture.

FIG. 2 shows a preparing process of a conventional amorphous silicon TFT (an inverse stagger type). As the substrate 201, such heat resistant and non-alkali glass as Corning 7059 is used. Since the maximum temperature of preparing process for the amorphous silicon TFT is around 350, it is required that the material therefor be resistant up to this temperature. Especially in case of a liquid crystal display panel, the material is in need of a heat resistant property and a high glass transition temperature not to be distorted by heat treatment. The Corning 7059 can meet for the need, as the glass transition temperature thereof is a little lower than 600.

Also, in order to stabilize an operation of TFT, it is not desirable that such movable ion as Na is contained in a substrate. There is no problem with the Corning 7059 having quite low content of alkalies, but it is necessary to form such passivation film as a silicon nitride film or an aluminum oxide film so that the movable ions in a substrate do not invade into TFT, in case a lot of Na etc. is contained in the substrate.

Next, a film is formed using materials such as aluminum or tantalum, a patterning is effected using the mask 1 and the gate electrode 202 is formed. In particular, in order to prevent a short circuit between the gate electrode wiring and the upper wiring thereof, it is recommended to form the oxide film 203 on this gate electrode surface. An anode oxidation method is chiefly employed in the forming way of the oxide film.

Then, the gate insulating film 204 is formed. As the gate insulating film, a silicon nitride is generally used. But a silicon oxide can be also used, and a silicide mixed with nitrogen and oxygen in a free amount ratio can be used. Further both of the single layer and the polylayer films can be available. When a silicon nitride film is used as the gate insulating film and a plasma CVD method is applied, the process temperature becomes 350, the maximum temperature of the process, the situation of which is shown in FIG. 2(A).

Next, an amorphous silicon film is formed, it is necessary to raise a temperature of the substrate up to 250 to 300, in case a plasma CVD method is used. The film thickness is desired as thin as possible, it is generally to be 10 to 100 nm, and preferably to be 10 to 30 nm. The amorphous silicon region 205 is formed by patterning with the mask 2 which later will become a channel forming region of TFT. The situation so far is shown in FIG. 2(B).

Further, a silicon nitride film is formed all over the surface, which is patterned with the mask 3 to get the etching stopper 206. This stopper is prepared so that the amorphous silicon region 205 for a channel forming region will not be etched by mistake in a later process, because the amorphous silicon region 205 is as thin as 10 to 100 nm as aforementioned. Also, since the amorphous silicon region under part of the etching stopper functions as a channel forming region, the etching stopper is designed to overlap with the gate electrode as fully as possible. A conventional mask alignment, however, gives a somewhat discrepancy, then the patterning is carried out so as to achieve an enough overlapping with the gate electrode.

After that, N-type or P-type conductivity silicon film is formed. An ordinary amorphous silicon TFT is N-type one. This silicon film is prepared to be a microcrystal state, as an amorphous silicon is too low in a conductivity. N-type microcrystal silicon film can be prepared at a temperature of 350 or below by a plasma CVD method. But it is not low enough in resistance, and then the thickness of 200 nm or more was required. P-type microcrystal silicon film was too big in resistance to be used, it was, therefore, difficult to prepare a P-channel type TFT with an amorphous silicon.

The silicon film prepared in this way is patterned using the mask 4 to form N-type microcrystal silicon region 207. The situation so far is shown in FIG. 2(C), in which a function of TFT can not be realized, as (N-type) microcrystal silicon film is connected with itself on the etching stopper. It is, therefore, necessary to separate the connection, and the groove 208 is formed by separating the connection using the mask 5. It is feared that even the amorphous silicon region 205 as a base is etched out making a mistake, if there is no etching stopper in this case. This is caused by the reason that the microcrystal silicon region 207 is from several to some ten times or more as thick as the amorphous silicon region thereunder. Afterward, the wiring 209 and the pixel electrode 210 are prepared, using the masks 6 and 7 by a known method, the situation of which is shown in FIG. 2(D).

In the method stated above, so many seven sheets of mask are used, and it is worried that a yield will be lowered. Therefore, a decreasing way of the number of masks has been proposed as will be described in the following; Firstly, a gate electrode part is patterned on a substrate using the first mask. Then, a gate insulating film is formed, further, an amorphous silicon film and a silicon nitride film (later will be an etching stopper) are continuously formed. Next, an etching stopper is formed by etching only the silicon nitride film in a way of self-alignment, using a gate electrode as a mask and exposing from the back. Then, thereon a microcrystal silicon film is formed, and a TFT region including a groove over the channel(corresponds to the numeral 208 in FIG. 2) is formed using the second mask. Afterward, a wiring and an electrode are formed using the third and fourth masks. Finally, the equivalent one as shown in FIG. 2(D) can be obtained. In such way, the number of masks can be reduced by three utilizing a self-alignment process.

Thus formed TFT is very uneven, as distinct from FIG. 2(D). This is mainly derived from the gate electrode part (contains gate electrode oxide 203), the etching stopper, and the microcrystal silicon region. A total 800 nm of unevenness will happen, supposing that each thickness of the gate electrode part, the etching stopper, and the microcrystal silicon region 206 is 300 nm, 200 nm, and 300 nm respectively. For example in case where TFT is used in an active matrix circuit of a liquid crystal display panel, the thickness of a cell is 5 to 6m and is controlled to an accuracy of 0.1m or less. Under such condition, even 1m of unevenness will cause a remarkable defect to a thickness uniformity of a cell.

However, any of these factors to cause the unevenness of TFT can not be cut down easily. Namely, the thinner a gate electrode part is, the higher the resistance of gate electrode wiring will be. On the other hand, in order to keep the constant resistance, widening of a gate electrode (i.e. lengthening of a channel) will bring about not only lowering of TFT operation speed but also large area of TFT part, which will cause an aperture ratio to be lowered in case TFT is used in a liquid crystal display.

Also, in case the etching stopper is thin, there is a possibility that even an amorphous silicon region underlying a microcrystal silicon region will be in error to be etched, during the etching of the microcrystal silicon region, and then a yield will be lowered. Further, in case the microcrystal silicon region is thin, the source/drain region resistance of TFT will be increased and ON/OFF ratio of TFT will be decreased.

Still more, the etching stopper will remain as it is, at the time of completion of TFT. The silicon nitride film used for the etching stopper has a nature to trap electric charge. If electric charge is trapped therein for some reason, an unwilling channel will be formed in the amorphous silicon region 205 thereunder, which will cause a leak of drain current. To avoid this problem, it is necessary to cause the etching stopper to be two layer structures of silicon oxide and silicon nitride. In this case, it is needed that the silicon oxide film be also thick enough, and preferably be 100 nm thick or more.

SUMMARY OF THE INVENTION

The present invention seeks to solve such problems. Accordingly,it is an object of the present invention to simplify the process. For example, it is to improve a yield by decreasing the number of masks compared with that in a conventional method. It is also to improve a through-put and to reduce a cost, by decreasing the film-forming processes. It is another object of the present invention to make TFT flat. According to this flattening, the problem posed in case TFT is used in a liquid crystal display panel can be settled. Also the flattening is an important technical subject in other applications, and can be applicable to what a conventional TFT has not been put to a practical use.

To overcome the above-mentioned problems, the present invention provides a new preparing method for TFT using no etching stopper, and also provides TFT prepared by the method thereof. Further, for purpose of making a microcrystal silicon region (source/drain) thin, the resistance thereof will be sufficiently rendered low. Still more, in accordance with the present invention, a sheet of silicon film will be formed by no way of conventional two-stage processes, which are the forming of an amorphous silicon region (film) to become a channel forming region, and the forming of a microcrystal silicon region (film) to become a source/drain region. And this one sheet of silicon film will be reformed partly for a source/drain region and partly for a channel forming region.

In case of the through-put improvement, it is the most important subject to reduce the film formings. The film forming process takes much time and also requires an equal time for cleaning of a chamber innerside, thereby, the actual condition being that the film forming is carried out between the chamber cleanings, in the present semiconductor process where the purest environment is demanded. It is, therefore, necessary for the purpose of through-put improvement to form a thin-film than a thick-one, and to form a single layer film than a multilayer one. This means that the reduction of the film forming processes is most desirable.

TFT in one mode of the present invention is claimed as follows; Firstly it is an insulated gate field effect transistor (TFT) of an inverted stagger type. A gate insulating film is formed covering a gate electrode provided on an insulating substrate, and a semiconductor film is formed on the gate insulating film to a thickness of 10 to 100 nm. But the upper part thereof provided on the gate electrode is substantially intrinsic so as to function as a channel forming region. Other parts are N-type or P-type, and fulfill function as source/drain. Also the part functioning as a channel forming region can be taken to be amorphous, semi-amorphous, microcrystal, polycrystal, or an intermediate state thereof. In case where an off-current is suppressed, an amorphous is preferable. On the other hand, the region functioning as source/drain is polycrystal, semiamorphous, or microcrystal, each of which is low enough in resistance. Moreover, the present invention is characterized in that this region is formed by applying a laser annealing.

In the claimed invention, a mass production can be attained, as the film forming is all right by forming only one layer of a semiconductor film. Also, the unevenness of TFT can be reduced, if a conventional microcrystal silicon is not formed. Of course, it is needless to say that the present invention do not seek to form a channel forming region and such impurity region as source/drain with only one layer of a semiconductor film, but a multilayer of a semiconductor film may be formed, to improve the device properties taking cost and characteristics into account.

TFT in another mode of the present invention is characterized in that an etching stopper is not provided on a channel forming region, and in that at least silicon nitride or such similar material as have a nature to trap an electric charge does not exist, adhering to a channel forming region or through a thin (100 nm or less) insulating film.

The existence of an etching stopper is an important factor for the unevenness of TFT, and in case the stopper is composed of such material as silicon nitride, there will happen a leak of drain current. Such problems can be overcome by the above stated technological thoughts of the present invention. Of course, the technological thoughts of the present invention do not require that nobody exists on a channel forming region, and there poses no problem, even if somebody exists to such degree as not to reveal the above-mentioned problems.

BRIEF DESCRIPTION OF THE DRAWINGS

The objects, features, and advantages of the present invention will become more apparent, from the following description of the preferred embodiments taken in conjunction with the accompanying drawings, in which:

FIG. 5 shows a preparing process diagram of TFT in accordance with the present invention.

FIG. 6 shows a preparing process diagram of TFT in accordance with the present invention.

FIG. 7 shows a preparing process diagram of TFT in accordance with the present invention.

FIG. 8 shows a preparing process diagram of TFT in accordance with the present invention.

FIG. 9 shows a conventional preparing process diagram of TFT.

FIG. 10 shows a conventional preparing process diagram of TFT.

DETAILED DESCRIPTION OF THE PREFERRED EMBODIMENT

Figure 1A:
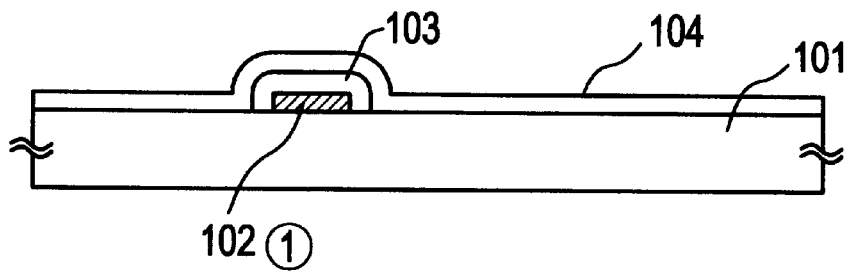
FIG. 1 shows a fragmentary cross-sectional view of a preparing method of TFT in accordance with the present invention.
Figure 1B:
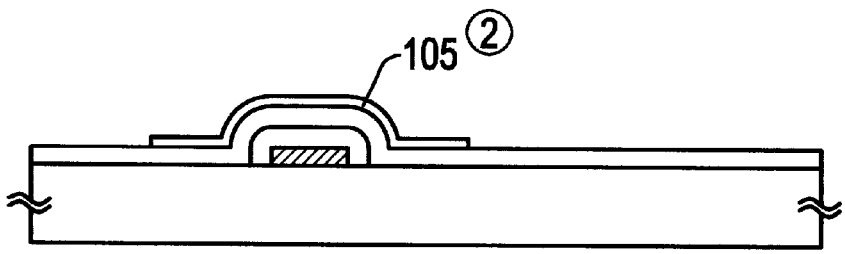
Figure 1C:
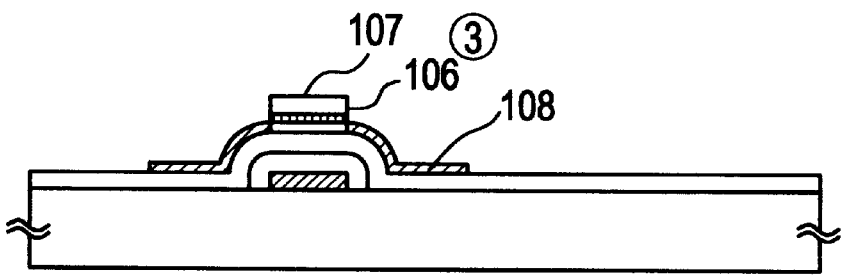

The present invention will be explained in more detail, by reference to the following Examples in connection with the drawings. The present invention is by no means limited to the Examples, without departing from the spirit and the scope thereof.

The preparation of TFT according to the present invention will be effected by the method as shown in FIG. 1. Of course, there may be some modifications to the process in FIG. 1, if necessary. As shown in FIG. 1, the gate electrode 102 will be patterned with the mask 1, on the substrate 101 which is heat-resistant and non-alkali glass. If necessary, it may be possible that an insulating property is improved, by forming the oxide film 103 on the surface of gate electrode. Then, the gate insulating film 104 will be formed, thereby FIG. 1(A) being obtained.

Next, an amorphous, semiamorphous, microcrystal, polycrystal,or the intermediate state thin silicon film will be formed, and patterned with the mask to form the semiconductor region 105. In many actual cases, an amorphous silicon film will be formed considering a film forming temperature and an off current, but it may be possible that a polycrystal or a semiamorphous silicon is obtained, using such low temperature crystallization art as a laser annealing. In case a polycrystal or a semiamorphous silicon is used, a large electric field mobility can be obtained, however, it is not suitable for an active matrix circuit of liquid crystal display panel, because an off-current increases.

After that, a film to be a masking material against the laser beams, e.g., silicon nitride film rich in silicon content (50 nm or more of thickness is favorable) will be formed, which will be patterned with the mask 3. At this time, a photoresist can be made to remain on the silicon nitride film if necessary. Namely, in FIG. 1(C), the numeral 106 indicates a silicon nitride film and 107 indicates a photoresist. The thickness of photoresist is 100 nm or more and is favorably 500 nm or more, supposing a later ion implantation process.

At this situation, firstly an impurity will be selectively implanted into the semiconductor region 105, by an ion implantation or an ion doping method etc. thus being formed the impurity region 108. The impurity implantation, however, brings about very big defects in a semiconductor film, which no longer functions as a semiconductor. Accordingly, a crystallization will be effected by radiating laser beams from upward. In this laser annealing process, various conditions of silicon ranging from polycrystal but very close to single crystal to amorphous can be formed, by properly controlling a pulse width and an energy density of the laser beams.

If there is no silicon nitride film 106, the laser beams will reach the region where functions as a channel forming region not doped with an impurity, and will enable its part to be crystallized. In case where a silicon nitride film exists, by which a lot of beams will be absorbed, then the crystallization will not occur and the initial situation will be maintained. It is considered favorable from the mobility increasing point of view that a channel region will be crystallized by laser beams. The present-day laser technologies, however, have a deviation in a laser shot-energy, which gives rise to a remarkable deviation in the crystallization degree. As a result, TFT with different mobilities will be formed.

There is no problem when TFT with a constant mobility is only required. But the condition will be extremely strict, provided that the mobility is satisfied with a constant lower limit and further the off-current is satisfied with a constant upper limit. This comes from the reason that in general TFT with a big mobility will be also big in the off-current. For example, since not only the mobility but also the off-current is important factor, in an active matrix circuit of a liquid crystal display panel, uniformly good TFTs are required. Accordingly in such case, it is desired that TFT is formed using an amorphous silicon which has a low off-current, even if it has a low mobility, or using a material which is similar to the amorphous silicon. Consequently, in the present invention, the laser beams should be prohibited from being entered into a channel forming region by mistake, in the case of such purposes.

This doping process may be done by a laser doping. The laser doping is a method that a sample (a semiconductor film) will be placed in an atmosphere containing an impurity, and by irradiating laser beams or equivalent strong beams to the sample (semiconductor film) in the atmosphere, the sample surface will be heated and activated and an impurity gas will be decomposed to diffuse the impurity over the sample surface. By the laser doping, the impurity is introduced into the semiconductor film and the semiconductor film is crystallized. As the impurity gas, in general $PH_3$ (phosphine) will be used in case where N-type is furnished, and $B_2H_6$ (diborane) will be used in case where P-type is furnished.

By the present inventors' knowledge, in case of the laser beams radiation, a heating of a sample (the semiconductor film) at around 250 to 500° C. enabled the impurity to diffuse into an inside of the sample, causing the impurity concentration thereof to be high enough. It is not desired to place the sample at a too high temperature, so as to keep an amorphous state in the channel forming region, and there is some restrictions added to a glass substrate. So that, it is preferable to put an end of heating to around 250 to 350° C.

Also in case of the laser doping, the photoresist mask 107 is not always needed. In such doping method as an ion implantation, such mask as a photoresist, which is thick enough to enable an ion energy to be thoroughly slowed down, so that a high energy ion to be implanted will not enter into the channel forming region in mistake, is required. However,since the laser doping is a kind of heat-diffusion method, only such silicon nitride mask 106 as a material to have a full masking action to the heat-diffusion will do as a mask. The details about the laser doping technology are disclosed in the Japanese Patent Application No. Heisei 3-283981 filed by the present inventors et al.

After such doping was executed as above, the silicon nitride film 106 and the photoresist (will be evaporated by laser beams radiation in most cases) 107 will be removed, and then, the wiring 110 and the pixel electrode of ITO (Indium Tin Oxide) 111 will be formed using the mask 4 and the mask 5 by a known method. In the above processes, there totally used five sheets of mask, but these can be reduced to four sheets of mask, by freely using a self-alignment method as usual. Namely, for the formings of gate electrode, semiconductor region, as well as pixel electrode and wiring, 1-, 1-, and 2-sheet of mask are respectively necessary. The patterning for the silicon nitride film 106 etc. will be effected by the back exposure (e.g. by irradiating a light from under the substrate to the mask material (the silicon nitride film) provided on the semiconductor region), using the gate electrode as a mask.

Figure 1D:
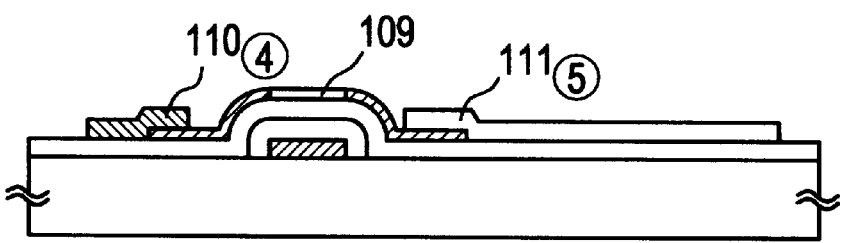
Figure 2A:
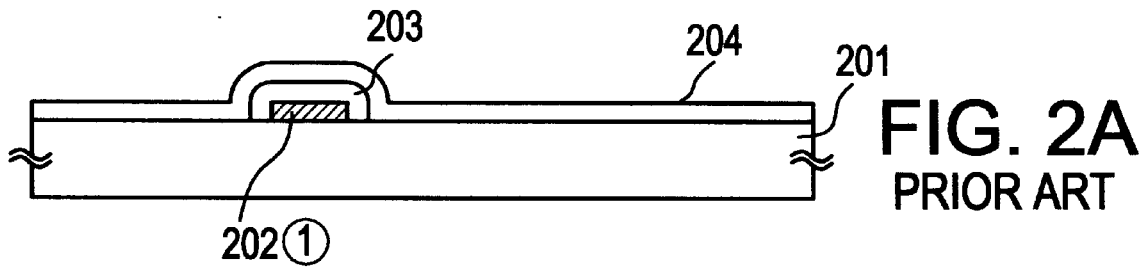
FIG. 2 shows a fragmentary cross-sectional view of a conventional preparing method of TFT.
Figure 2B:
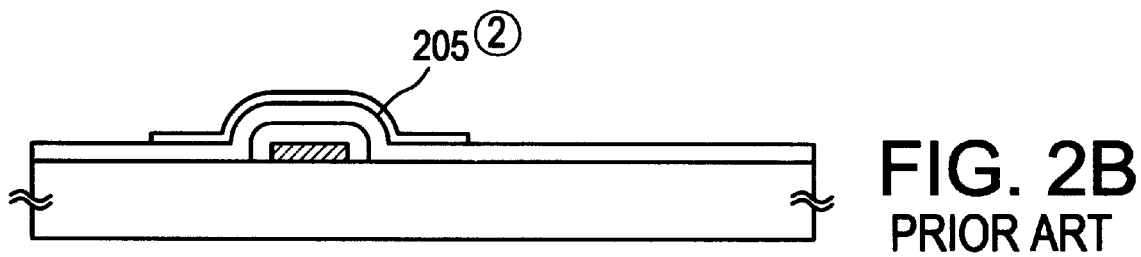
Figure 2C:
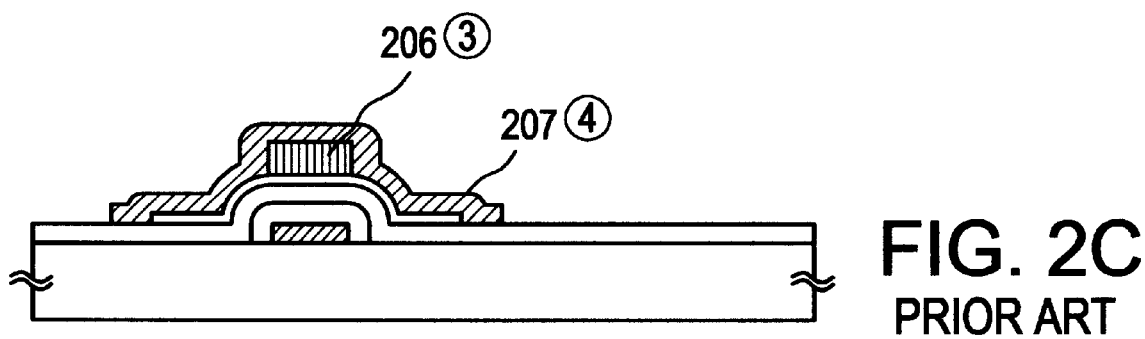
Figure 2D:
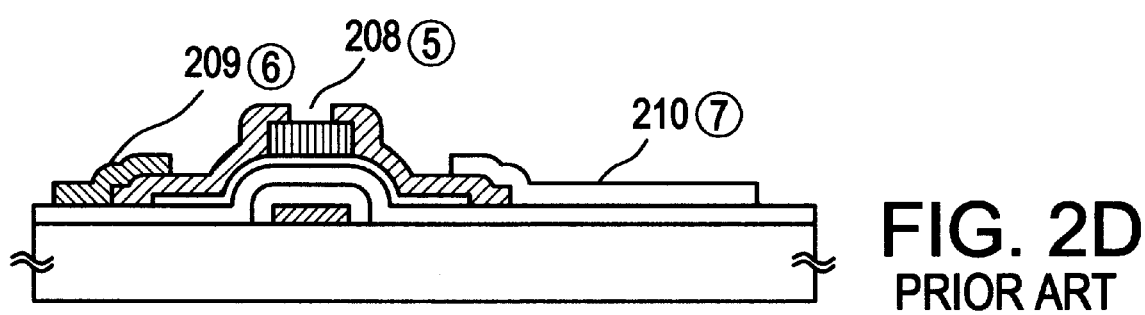

As is evident in FIG. 1(D), TFT according to the present invention is smaller in an unevenness than that of a conventional one. This is due to the fact that the unevenness is chiefly caused by only an unevenness of the gate electrode. The semiconductor region 105 is very thin, and the thickness thereof is 10 to 100 nm, similar to the usual TFT, which will not contribute much.

In this way, the semiconductor region, i.e., source/drain can be available though it is thin. This is attributed to that the said region is high in an impurity concentration, and also is in a good crystalline state. In other words, the features of the present invention have been brought about by the laser annealing or the laser doping. Also, the masks used in the present invention are not needed to remain, after completion of TFT, then the unevenness of TFT can be exceedingly reduced.

In accordance with the present invention, a practical P-channel TFT (hereinafter referred to as PTFT), which could not be prepared by a conventional technology in addition to N-channel TFT (hereinafter referred to as NTFT) prepared mainly with a usual amorphous silicon TFT, has come to be prepared. That is, PTFT has not been practical so far, because not only the hole mobility in an amorphous silicon of a channel region was small compared with the ion mobility, but also P-type silicon with low enough resistance of source/drain could not be obtained. In accordance with the present invention, however, the resistance of P-type silicon has been able to be as low as that of N-type silicon, and then, PTFT having a practical function of the device has been able to be prepared.

Therefore, it has begun to be able to prepare a complementary type MOS circuit (hereinafter referred to as CMOS circuit), using the amorphous silicon TFT or TFT prepared at low temperatures. Up to the present time, the CMOS circuit has been limited to the high temperature prepared TFT formed on a quartz substrate at 1000° C. or higher, or the middle temperature prepared TFT formed on a non-alkali glass substrate at around 600° C. It has been so far considered that CMOS circuit can not be obtained, using TFT prepared at around 350° C. of the maximum process temperature.

The instance is shown in FIG. 3. In the same way as indicated in FIG. 1, the gate electrode of NTFT 302 and the gate electrode of PTFT 303 will be formed on the substrate 301, using the first mask. Then if necessary, the gate electrode surface will be oxidized by an anode oxidation method, and thereafter the gate insulating film 304 will be formed. Further, the semiconductor regions of NTFT 305 and PTFT 306 will be formed using the second mask.

The better crystallized state of a semiconductor is, the bigger mobility of PTFT will be obtained. It is not preferable that the mobility between NTFT and PTFT is so different from each other, in order to function as CMOS. Though PTFT with a big mobility can be gotten by enabling a film forming temperature to be higher, it can not be excessively raised under such condition as substrate restrictions. But in case where a film is formed at around 350° C. of a substrate temperature using such polysilane as disilane or trisilane, PTFT, which is seemingly amorphous but its mobility is about one over several of that of NTFT, will be gotten. Also, it is possible that an annealing will be carried out in an atmosphere of hydrogen at 300 to 350° C. for 24 hr. or more, after the film forming by CVD plasma method.

Figure 3A:
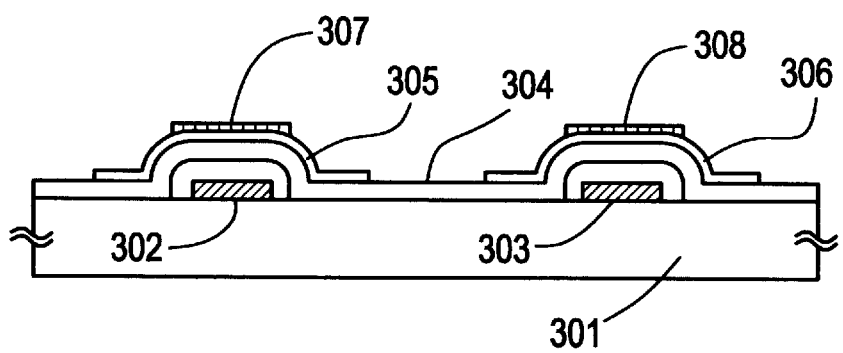
FIG. 3 shows a fragmentary cross-sectional view of a preparing method of TFT in accordance with the present invention.

Then, the silicon nitride films 307 and 308 will be patterned using the third mask. Of course, as mentioned before, this silicon nitride mask may be formed in a self-alignment, by the back exposure using a gate electrode as a mask. In this case the third mask is not necessary. The cross-sectional view of thus obtained device is shown in FIG. 3(A).

Figure 3B:
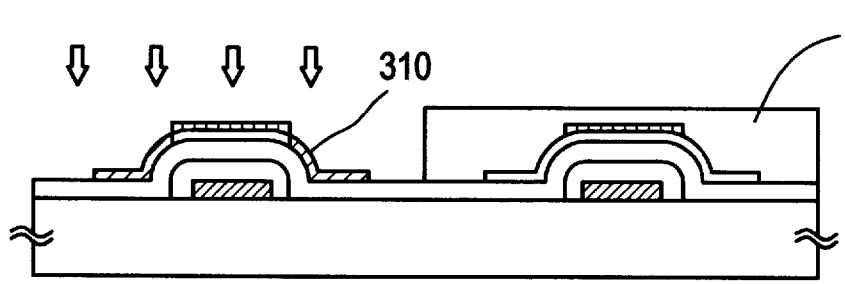
Figure 3C:
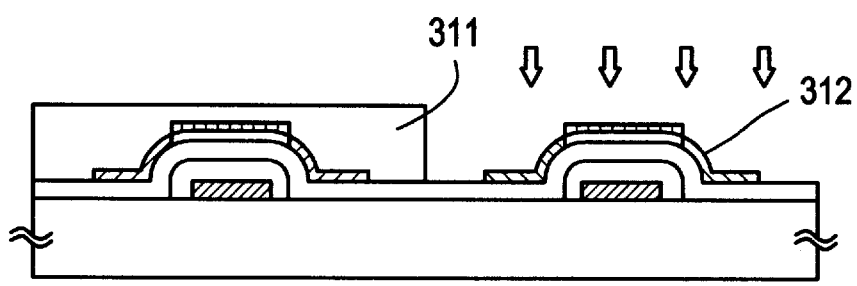
Figure 3D:
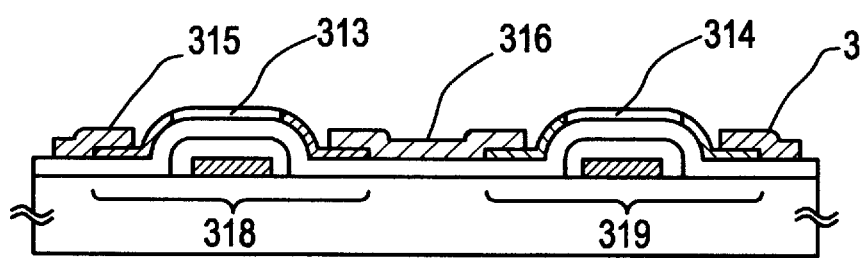
Figure 4A:
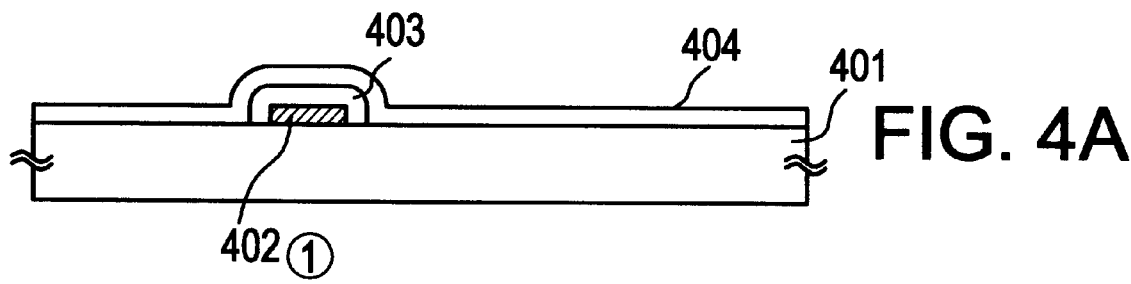
FIG. 4 shows a fragmentary cross-sectional view of a preparing method of TFT in accordance with the present invention.
Figure 4B:
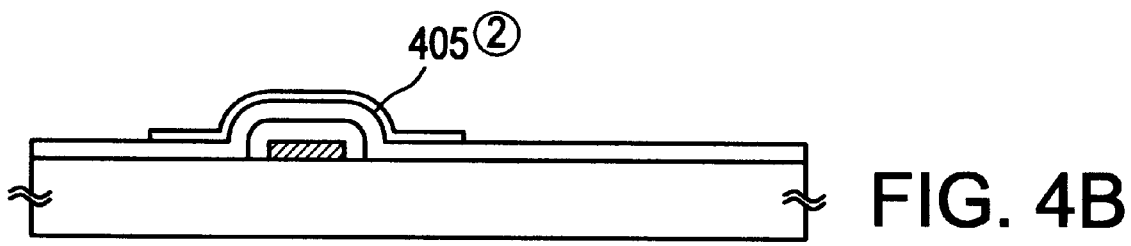
Figure 4C:
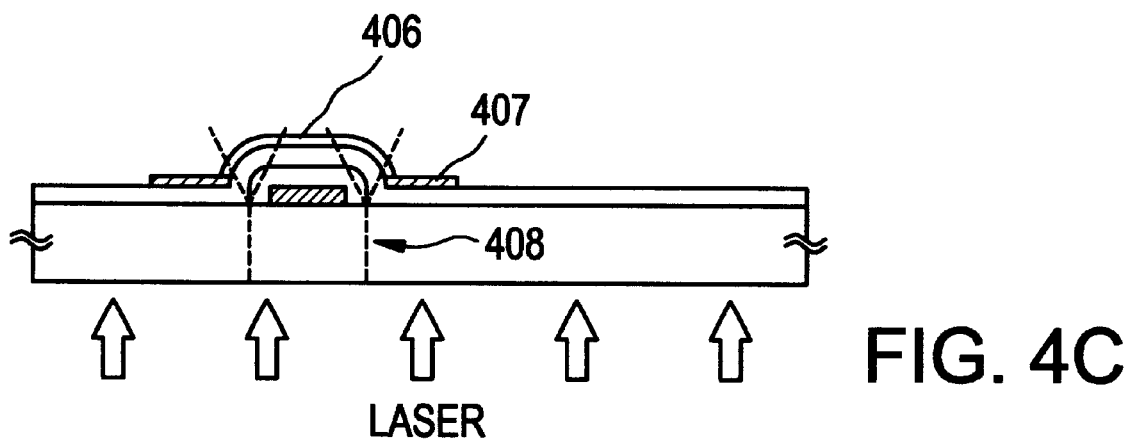
Figure 4D:
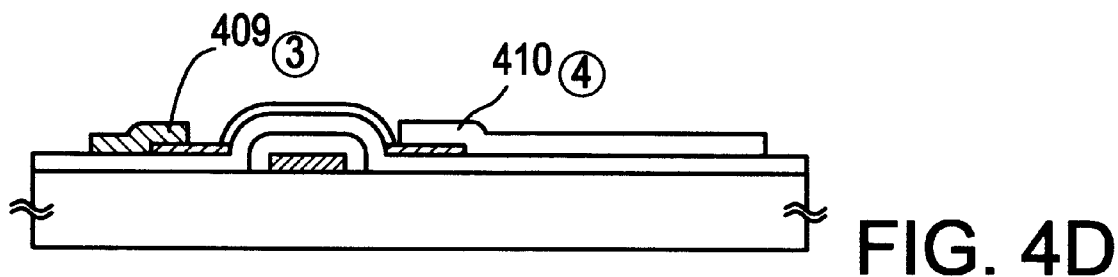

After that, the photoresist mask 309 will be formed in the region of PTFT using the fourth mask, and laser beams will be radiated in an atmosphere of phosphine $PH_3$ as illustrated in FIG. 3(B). Thereby the impurity region 310 of NTFT (left side) will be formed. Further, the photoresist mask 311 will be formed in NTFT region using the fifth mask, and laser beams will be radiated in an atmosphere of diborane $B_2H_6$ as illustrated in FIG. 3(C), to form an impurity region 312 of PTFT (right side). In each laser doping process, laser beams will be absorbed into the silicon nitride mask, and then the channel forming regions 313 and 314 will not be crystallized.

Then, as shown in FIG. 3(C), the metal wirings (aluminum etc.) 315, 316, 317 will be formed by a known metal wiring technology, thus being formed CMOS circuit consisting of NTFT 318 and PTFT 319. In the above processes, six sheets of mask are used, but one sheet of mask will be reduced, if the back exposure technology is used in case of the preparation of silicon nitride masks 307, 308. The doping process will be also conducted by a known ion implantation or ion doping method. In case where an impurity region is formed by an ion implantation or an ion doping method, which is capable of a delicate controlling of an impurity concentration, it is possible to firstly form an impurity region of either conductivity type in all of TFT, and then to form an inverse conductivity type only in a specific TFT, not separately forming both impurity regions of NTFT and PTFT. In this case, one sheet of mask will be further reduced. This method, however, can not be applicable to the laser doping, on account of its difficulty in an impurity controlling.

If such method is desired to be done by the laser doping, it will be performed as follows; Firstly a certain conductivity type impurity region will be formed toward all of TFT, setting a substrate temperature at a little low, and then an inverse conductivity type doping will be effected only to the specific TFT, raising the substrate temperature. This comes from the reason that the higher the substrate temperature is, the more concentration of an impurity will be doped.

In the present invention, especially regarding the laser doping, such method as is shown in FIG. 4 can be also used. This method conducts the doping in a self-alignment, using the gate electrode as a mask and radiating laser beams from the back. First of all, in the same way as in the case of FIG. 1, the gate electrode 402 will be formed using the mask 1 on the substrate 401 which passes laser beams. If necessary, its oxide 403 will be formed, and also the gate insulating film 404 will be formed. Then, the semiconductor region 405 will be patterned using the mask 2 (FIGS. 4(A),(B)). Next, laser beams will be radiated from the back of substrate. This time, the laser beams pass in parallel in the substrate as illustrated in FIG. 4(C), but are refracted in the gate electrode where is uneven, and diffracted in the gate electrode etc. thus resulting in that the parallel passing is injured. Additionally, in such uneven parts, laser beams are more absorbed in the parts (the oxide layer 403 or the gate insulating film 404), where the laser beams pass through, compared with the other parts. As a result, the intensity of laser beams will be extremely lowered on the protrusion part over the gate electrode part, not only by being masked with a gate electrode but also by the above stated complicated phenomena. Then, the laser doping will no longer be carried out, and the initial situation will be kept to become the channel forming region 406. On the other hand, in the other parts, the laser doping will be performed and the impurity region 407 will be formed. Then, it will do well that the metal wiring 409 and the pixel electrode 410 etc. is formed using the masks 3 and 4.

This method is very simple in the process compared with the other methods. Namely, the number of masks is four sheets, similar to the case where the self-aligning process of the back exposure was adopted in the method of FIG. 1. Also the exposure processes for forming a mask (e.g., 106 of FIG. 1) will be reduced by one, different from the method of FIG. 1. As a matter of course, the forming process of silicon nitride film etc. used for a mask is not necessary. Also, the overlapping of source/drain and gate electrode is rare and the parasitic capacity can be suppressed. This is the most remarkable features of this method.

This method, however, is in need of using a transparent substrate against the laser beams. The Corning 7059 glass substrate is an ideal non-alkali glass, but this is not good in the transparency of ultraviolet beams, so that it is not appropriate to conduct a laser doping using an excimer laser. If the Corning 7059 glass is to be used by all means, it is required to use a long wave of laser beams (e.g., argon ion laser or Nd:YAG laser etc.). Moreover, it is also possible to lengthen twice or more as long as the wave, by using a non-linear type optics effect of the excimer laser beams.

EXAMPLE 1

This Example was carried out according to the preparing process shown in FIG. 5, and the cross-sectional view of process thereof corresponds to FIG. 1, but to as far as the forming process of the metal wiring/electrode 110 in FIG. 1. Then, the forming process of ITO pixel electrode 111 is not contained therein. The gate electrode is made of tantalum, on the surface of which about 200 nm thick anode oxide film was formed in the process 5 to improve the insulating properties. An ion doping method was employed as an impurity doping means. The number of the masks used in this process was four sheets, and all the processes consisted of 26 steps.

In FIG. 5 to FIG. 10, SPUTTERING, PCVD, and RIE are meant by a sputtering film forming method, a plasma CVD method, and a reactive ion etching method respectively. The descriptions following these methods are meant by a film thickness, a used gas and the like. As for a conventional preparing process corresponding to the present Example, the cross-sectional view is shown in FIG. 2, and the process diagram is shown in FIG. 9. Here, six sheets of mask were used and all the processes were twenty-nine.

According to the process diagram, the present Example will be explained in detail below. As a substrate, Corning 7059 glass (101 in FIG. 1)was used, which was washed (process 1), and 200 nm thick tantalum film was formed thereon by a sputtering method (process 2). Then, this was patterned using the mask 1 (process 3), and etched with a mixed acid phosphoric acid containing nitric acid by 5%) (process 4) to form a single layer comprising tantalum as a gate electrode on the substrate. After that, the anode oxide film (103 in FIG. 1) was formed in thickness of 200 nm, by effecting an anode oxidation supplying the tantalum gate electrode (102 in FIG. 2) with current. The maximum voltage was 250 V (process 5). The way of anode oxidation was disclosed in Japanese Patent Application Nos. Heisei 3-237100 and Heisei 3-238713, then no explanation in detail is here.

Next, the resist was removed (process 6), and the silicon nitride film (104 in FIG. 1) as a gate insulating film was formed, in thickness of 200 nm by a plasma CVD method (process 7). At this time, the substrate temperature was set at 300. After washing of the substrate (process 8), an amorphous silicon film was formed in thickness of 30 nm by a plasma CVD method (process 9). The substrate temperature at this time was controlled at 300

Then, a patterning in a semiconductor region was carried out using the mask 2 (process 10), and the amorphous silicon film was etched by a reactive ion etching method using $CF_4$ as a reactive gas (process 11), to form the semiconductor region (105 in FIG. 1). The remaining resist was removed (process 12), and the substrate was washed (process 13).

After that, 200 nm thick silicon nitride film was formed on the semiconductor region by a plasma CVD (process 14). At this time, the temperature of substrate was set at 300. The patterning of silicon nitride mask was effected (process 15) using the mask 3, and the silicon nitride film was etched with a buffer hydrofluoric acid (process 16), to form the silicon nitride mask pattern on the semiconductor region (106 in FIG. 1), on which about 500 nm thick resist (107 in FIG. 1) remained.

Next, by an ion doping method, $1\times10^{14} cm^{-2}$ dose of phosphorus ion was implanted (introduced) into the semiconductor region with the silicon nitride mask pattern as a mask using 10 KeV of accelerated energy (process 17), to form the impurity region (108 in FIG. 1). Then, the substrate was washed (process 18), to remove the remaining resist (process 19). And then, a laser annealing was executed by irradiating XeCl excimer laser beam to the semiconductor region with the silicon nitride mask pattern as a mask (process 20) to crystallize the semiconductor region, and the silicon nitride mask pattern (106 in FIG. 1) was etched with a buffer hydrofluoric acid and removed (process 21). After that, the substrate was washed (process 22).

Then, an aluminum film was formed in thickness of 400 nm by a sputtering method (process 23). The aluminum wiring was patterned with the mask 4 (process 24), and further the aluminum film was etched by a mixed acid (process 25) to form the aluminum wiring (110 in FIG. 1). The remaining resist was removed (process 26). NTFT was prepared through the above processes.

EXAMPLE 2

The present Example was conducted in accordance with the preparing process shown in FIG. 6. The cross-sectional view of preparing process corresponds to FIG. 1, excepting the usage point of the back exposure technology. But FIG. 6 indicates as far as the forming process of the metal wiring/electrode 110 in FIG. 1, similar to Example 1. A gate electrode was made of aluminum, on the surface of which about 200 nm thick anode oxide film was formed in the process 5, to improve an insulating property thereof. A back exposure technology was adopted in the forming of silicon nitride mask, and an ion doping method was employed as the impurity doping means. The number of the mask sheets used in the present process was three, being reduced by one sheet according to the back exposure technology, and all the processes were made up of twenty-six.

A conventional preparing process corresponding to the present Example is shown in FIG. 10, in which three sheets of masks were used and all the processes were twenty-three. The present Example will be explained in detail in accordance with the process diagram as follows. As a substrate, Corning 7059 glass (101 in FIG. 1) was used. This was washed (process 1), and thereon an aluminum film was formed in thickness of 400 nm by a sputtering method (process 2). Then, the film was patterned using the mask 1 (process 3), and etched with a mixed acid (phosphoric acid containing nitric acid by 5%) (process 4) to form a single layer comprising aluminum as a gate electrode. Next, an anode oxidation was effected supplying the aluminum gate electrode (102 in FIG. 1) with current, and the anodic oxidation film (103 in FIG. 1) was formed in thickness of 200 nm on an upper surface and a side surface of the gate electrode, increasing a voltage up to 250V in maximum (process 5).

After that, the resist was removed (process 6), and as a gate insulating film, the silicon nitride film (104 in FIG. 1) was formed in 200 nm thick over the anodic oxidation film by a plasma CVD method (process 7). At this time, the substrate temperature was set at 300. After washing of the substrate (process 8), 30 nm thick amorphous silicon film was formed by a plasma CVD method controlling the substrate temperature at 300 (process 9).

Then, the semiconductor region was patterned using the mask 2 (process 10), and the amorphous silicon film was etched by a reactive ion etching method using $CF_4$ as a reaction gas (process 11), thereby forming the semiconductor region (105 in FIG. 1). The remaining resist was removed (process 12), and the substrate was washed (process 13).

After that, 200 nm thick silicon nitride film was formed by a plasma CVD method (process 14). At this time, the substrate temperature was controlled at 300. Then, an exposure was effected from the back of substrate with a resist painted, and the silicon nitride mask was patterned in a self-alignment, using a gate electrode as a mask (process 15). And then, the silicon nitride film was etched with a buffer hydrofluoric acid (process 16), thereby forming the silicon nitride mask (106 in FIG. 1). Thereon about 500 nm thick resist (107 in FIG. 1) remained.

Next, $1\times10^{14}cm^{-2}$ dose of phosphorus ion was implanted, by an ion doping method with 10 KeV of an accelerated energy (process 17), and the impurity region (108 in FIG. 1) was formed. A substantially intrinsic region 109 was then formed. And then, the substrate was washed (process 18), and the remaining resist was removed (process 19). Then, a laser annealing was executed using XeCl excimer laser (process 20), and the silicon nitride mask (106 in FIG. 1) was etched with a buffer hydrofluoric acid and removed (process 21). Subsequently, the substrate was washed (process 22).

Finally, an aluminum film was formed in thickness of 400 nm by a sputtering method (process 23), an aluminum wiring was patterned using the mask 4 (process 24), and further an aluminum film was etched with a mixed acid (process 25), thereby forming the aluminum wiring (110 in FIG. 1). The remaining resist was removed (process 26). Thus, NTFT was prepared by way of the above processes.

EXAMPLE 3

The present Example was conducted according to the preparing process shown in FIG. 7. The cross-sectional view of the preparing process corresponds to FIG. 4. However, FIG. 7 indicates only up to the forming process of the metal wiring/electrode 409 in FIG. 4. A gate electrode was made of aluminum, on the surface of which about 200 nm thick anode oxide film was formed to improve an insulating property in the process 5. As an impurity doping means, a laser doping technology with laser beams radiation from the back was employed. The number of the masks used in this process was three, and all the processes were nineteen.

The following is a detail explanation of the present Example in accordance with the process diagram. As a substrate, Corning 7059 glass (401 in FIG. 4) was used. This was washed (process 1), and 400 nm thick aluminum film was formed thereon by a sputtering method (process 2). This was patterned with the mask 1 (process 3), and etched with a mixed acid (by 5% nitric acid contained phosphoric acid) (process 4). Then, an anode oxidation was effected supplying the aluminum gate electrode (402 in FIG. 4) with current, and the anode oxide film (403 in FIG. 4) was formed in thickness of 200 nm, raising the voltage up to 250V in maximum (process 5).

Afterward, the resist was removed (process 6), and the silicon nitride film (404 in FIG. 4) as a gate insulating film was formed in thickness of 200 nm by a plasma CVD method (process 7). At this time, the substrate temperature was set at 300. After washing of the substrate (process 8), 30 nm thick amorphous silicon film was formed by a plasma CVD method (process 9). The substrate temperature at this time was set at 300.

Then, the semiconductor region was patterned with the mask 2 (process 10), and the amorphous silicon film was etched, by a reactive ion etching method using $CF_4$ of a reaction gas (process 11), to form the semiconductor region (405 in FIG. 4). The remaining resist was removed (process 12), and the substrate was washed (process 13).

Next, the laser doping of the semiconductor region was performed in a self-alignment method, using the gate electrode as a mask, and irradiating XeCl excimer laser beams to the semiconductor region from the back of the substrate (from under the substrate) with the semiconductor film being placed in an atmosphere comprising the impurity (phosphine) (process 14). Since the XeCl excimer laser was 308 nm in a wave length, it was able to pass through Corning 7059. The substrate temperature during the laser doping was set at 300, and then the substrate was washed (process 15). The impurity is introduced into the semiconductor film and the semiconductor film is crystallized by the laser doping.

After that, an aluminum film was formed in a thickness of 400 nm by a sputtering method (process 16), the aluminum wiring was patterned with the mask 4 (process 17). Further the aluminum film was etched with a mixed acid (process 18), and the aluminum wiring (409 in FIG. 4) was formed. The remaining resist was removed (process 19). Thus, NTFT was prepared by the above processes.

EXAMPLE 4

The present Example is concerned with the forming of CMOS circuit, and carried out in accordance with the preparing process shown in FIG. 8. The cross-sectional view of the preparing process corresponds to FIG. 3. A gate electrode was made of aluminum, on the surface of which about 200 nm thick anode oxide film was formed in the process 5 to improve an insulating property. As an impurity doping means, a laser doping technology was adopted. In case of the doping, the regions of NTFT and PTFT were formed separately on the same substrate. The number of the masks used in the present processes was six, and all the processes were thirty-two.

The present Example will be explained in detail according to the process diagram as follows. As a substrate, Corning 7059 glass (301 in FIG. 3) was used. This was washed (process 1), and an aluminum film was formed in a thickness of 400 nm thereon by a sputtering method (process 2). Then, this was patterned with the mask 1 (process 3), and etched with a mixed acid (by 5% nitric acid contained phosphoric acid) (process 4). After that, an anode oxidation was effected supplying the aluminum gate electrode (302 and 303 in FIG. 3) with current, and 200 nm thick anode oxide film was formed (process 5). The maximum voltage was 250V. A technical skill of the anode oxidation is not mentioned here in detail.

Then, the resist was removed (process 6), and the silicon nitride film (304 in FIG. 3) as a gate insulating film was formed, in 200 nm thick by a plasma CVD method (process 7). At this time, the substrate temperature was controlled at 300. After washing of the substrate (process 8), 30 nm thick amorphous silicon film was formed by a plasma CVD method (process 9). At this time, the substrate temperature was set at 250.

Next, the semiconductor region was patterned with the mask 2 (process 10), the amorphous silicon film was etched by a reactive ion etching method using $CF_4$ of a reaction gas (process 11), and the semiconductor regions (305 and 306 in FIG. 3) were formed. The remaining resist was removed (process 12), and the substrate was washed (process 13).

Then, 200 nm thick silicon nitride film was formed by a plasma CVD method (process 14). At this time, the substrate temperature was set at 300. The silicon nitride mask was patterned using the mask 3 (process 15), the silicon nitride film was etched with a buffer hydrofluoric acid (process 16), and the silicon nitride masks (307 and 308 in FIG. 3) were formed. The resist on the silicon nitride mask was removed (process 17).

After washing of the substrate (process 18), a pattern of NTFT was formed using the mask 4 (process 19). At this time, PTFT was covered with the resist (309 in FIG. 3). Under this state, the doping of phosphorus was effected by a laser doping in an atmosphere of phosphine (process 20) with the silicon nitride masks. In this way, the N-type impurity region (310 in FIG. 3) was formed. After the laser doping, the remaining resist (309 in FIG. 3) was removed (process 21), and the substrate was washed (process 22).

In the same way, a pattern of PTFT was formed using the mask 5 (process 23), when NTFT was covered with the resist (311 in FIG. 3). Under this condition, the doping of boron was executed by a laser doping method in an atmosphere of diborane (process 24). The impurity (boron) is introduced into a portion of the semiconductor region 106 which is not covered with the silicon nitride mask 308, and said portion is crystallized by the laser beam of the laser doping. Thus, the P-type impurity region (312 in FIG. 3) was formed. After the laser doping, the remaining resist (311 in FIG. 3) was removed (process 25), and the substrate was washed (process 26). Further, the silicon nitride masks (307 and 308 in FIG. 3) were etched with a buffer hydrofluoric acid and removed (process 27). Then, the substrate was washed (process 28).

Finally, an aluminum film was formed in a thickness of 400 nm by a sputtering method (process 29), an aluminum wiring was patterned with the mask 6 (process 30), further, the aluminum film was etched with a mixed acid (process 31), and the aluminum wirings (315, 316, and 317 in FIG. 3) were formed. The remaining resist was removed (process 32). NTFT was prepared by the above-mentioned processes.

In the foregoing description, the gate electrode is formed from a single layer made of aluminum or tantalum. However, the gate electrode may comprise a silicon layer and a metal layer provided on the silicon layer and comprising a material selected from the group consisting of aluminum and tantalum.

As evident from the above description, the present invention is characterized in that not only the process can be simplified, but also such TFT as is excellent in qualities (e.g., prominent high speed operation or small threshold voltage etc.) can be provided, because a sheet resistance of source, drain region is small. In this way, the present invention is useful in industry.

What is claimed is:

1. A method of manufacturing a thin film transistor comprising the steps of:

forming a gate electrode on an insulating surface of a substrate;

forming a gate insulating film comprising silicon nitride over said gate electrode;

forming a semiconductor film comprising polycrystalline silicon over said gate electrode with the gate insulating film interposed therebetween;

forming a mask comprising an insulating film on a portion of said semiconductor film and a photoresist film on said insulating film, said portion corresponding to a channel region of said thin film transistor wherein said insulating film comprises silicon nitride;

performing an ion doping of an impurity by using an acceleration voltage for selectively introducing impurity ions into said semiconductor film except for the portion covered by said mask to form impurity regions;

removing only said photoresist film while said insulating film remains on said portion of the semiconductor film;

irradiating said impurity regions with light from an upper portion of the insulating film for crystallizing the impurity regions wherein said impurity regions are exposed during said ion doping and said irradiation of light, wherein said channel region is prevented from being directly exposed to said light by said insulating film.

2. The method of claim 1 wherein said light is an excimer laser.

3. A method according to claim 1 wherein said light is a XeCl excimer laser light.

4. A method of manufacturing a thin film transistor comprising the steps of:

forming a gate electrode on an insulating surface of a substrate;

forming a gate insulating film over said gate electrode;

forming a semiconductor film comprising amorphous silicon over said gate electrode with the gate insulating film interposed therebetween;

forming a mask comprising an insulating film on a portion of said semiconductor film and a photoresist film on said insulating film, said portion corresponding to a channel region of said thin film transistor wherein said insulating film comprises silicon nitride; and performing an ion doping of an impurity by using an acceleration voltage for selectively introducing impurity ions into said semiconductor film except for the portion covered by said mask to form impurity regions;

removing only said photoresist film after the ion doping while said insulating film remains on said portion of the semiconductor film; and irradiating said semiconductor film with light to activate the introduced impurity, wherein said portion of the semiconductor film is prevented from being crystallized during the irradiation of said light by said insulating film.

5. A method of manufacturing a thin film transistor comprising the steps of:

forming a gate electrode on an insulating surface of a transparent substrate;

forming a gate insulating film over said gate electrode;

forming a semiconductor film comprising polycrystalline silicon over said gate electrode with the gate insulating film interposed therebetween;

forming an insulating film on said semiconductor film;

forming a photoresist film on said insulating film;

etching said insulating film and said photoresist film by a self-aligned exposure from a back-side of said transparent substrate with said gate electrode as a mask, thereby, forming a mask comprising an insulating film on a first portion of said semiconductor film and a photoresist film;

performing an ion doping of an impurity by using an acceleration voltage for selectively introducing impurity ions into said semiconductor film except for the first portion covered by said mask to form impurity regions;

removing only said photoresist film after the ion doping of said impurity with said insulating film remaining on said first portion;

irradiating said impurity regions with a light from an upper portion of the mask for crystallizing the impurity regions wherein said impurity regions are exposed during said ion doping and said irradiation of light, wherein said first portion of the semiconductor film is prevented from being directly exposed to said light by said irradiating film on said first portion of said semiconductor film.

6. The method of claim 5 wherein said light is an excimer laser.

7. A method according to claim 5 wherein said light is a XeCl excimer laser light.

8. A method according to claim 5 wherein said mask comprises silicon nitride.

9. A method of manufacturing a thin film transistor comprising the steps of:

forming a gate electrode on an insulating surface of a transparent substrate;

forming a gate insulating film comprising silicon nitride over said gate electrode;

forming a semiconductor film comprising amorphous silicon over said gate electrode with the gate insulating film interposed therebetween;

forming an insulating film comprising silicon nitride on said semiconductor film;

forming a photoresist film on said insulating film;

etching said insulating film and said photoresist film by a self-aligned exposure from a back-side of said transparent substrate with said gate electrode as a mask, thereby, forming a mask comprising an insulating film and a photoresist film on a first portion of said semiconductor film;

performing an ion doping of an impurity by using an acceleration voltage for selectively introducing impurity ions into said semiconductor film except for the first portion covered by said mask to form impurity regions;

removing only said photoresist film after said ion doping to maintain said insulating film on said first portion; and selectively irradiating said semiconductor film with light, wherein said first portion is prevented from being irradiated with said light by said insulating film.

10. A method of manufacturing a thin film transistor comprising the steps of:

forming a gate electrode on an insulating surface of a substrate;

forming a gate insulating film over said gate electrode;

forming a semiconductor film comprising silicon over said gate electrode with the gate insulating film interposed therebetween;

forming a photoresist mask over a portion of said semiconductor film wherein said photoresist mask is prevented from directly contacting said portion of the semiconductor film by an insulating film interposed therebetween, said insulating film comprising silicon nitride;

selectively introducing ions of an impurity into said semiconductor film by ion doping using an acceleration voltage to form impurity doped regions in said semiconductor film with a channel region defined below said photoresist mask;

removing said photoresist mask after the introduction of said ions; and then irradiating said impurity doped regions with a light in order to anneal said impurity doped regions, wherein said portion of the semiconductor film is covered with said insulating film during the irradiation of said light.

11. A method according to claim 10 wherein said semiconductor film comprises polycrystal silicon.

12. A method according to claim 10 wherein said light is a laser light.

13. A method according to claim 10 wherein said impurity doped regions are crystallized by said light.

14. A method of manufacturing a thin film transistor comprising the steps of:

forming a gate electrode on an insulating surface of a substrate;

forming a gate insulating film over said gate electrode;

forming a semiconductor film comprising silicon over said gate electrode with the gate insulating film interposed therebetween;

forming an insulating film comprising silicon nitride over said semiconductor film;

forming a photoresist mask over a portion of said semiconductor film wherein said photoresist mask is prevented from directly contacting said portion of the semiconductor film by said insulating film interposed therebetween wherein said photoresist mask is patterned by using said gate electrode as a mask;

selectively introducing ions of an impurity into said semiconductor film by ion doping using an acceleration voltage to form impurity doped regions in said semiconductor film with a channel region defined below said photoresist mask;

removing said photoresist mask after the introduction of said ions; and then irradiating said impurity doped regions with a light in order to anneal said impurity doped regions, wherein said portion of the semiconductor film is covered with said insulating film during the irradiation of said light.

15. A method according to claim 14 wherein semiconductor film comprises crystalline silicon.

16. A method according to claim 14 wherein said light is a laser light.

17. A method according to claim 14 wherein said impurity doped regions are crystallized by said light.

* * * * *